(12) United States Patent
Maruyama

(10) Patent No.: US 6,606,268 B2
(45) Date of Patent: Aug. 12, 2003

(54) NON-VOLATILE SEMICONDUCTOR INTEGRATED CIRCUIT

(75) Inventor: Akira Maruyama, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/214,935

(22) Filed: Aug. 8, 2002

(65) Prior Publication Data

US 2003/0033031 A1 Feb. 13, 2003

(30) Foreign Application Priority Data

Aug. 9, 2001 (JP) ........................................ 2001-243029

(51) Int. Cl.⁷ .............................................. G11C 16/04
(52) U.S. Cl. .............................. 365/185.28; 365/185.22
(58) Field of Search ........................ 365/185.28, 185.22, 365/185.12, 185.11, 185.14

(56) References Cited

U.S. PATENT DOCUMENTS 5,748,535 A * 5/1998 Lin et al. ................ 365/185.22
5,835,414 A * 11/1998 Hung et al. ............. 365/185.25
5,903,497 A * 5/1999 Yu et al. .................. 365/185.22
5,936,890 A * 8/1999 Yeom ..................... 365/185.22

OTHER PUBLICATIONS

Takeuchi, et al., "A Dual–Page Programming Scheme for High–Speed Multigigabit–Scale NAND Flash Memories", IEEE Journal of Solid–State Circuits, vol. 36, No. 5, May 2001 (pp. 744–751).

* cited by examiner

Primary Examiner—Anh Phung
(74) Attorney, Agent, or Firm—Harness, Dickey & Pierce, P.L.C.

(57) ABSTRACT

A programming operation and a verification operation are executed in divided parts or pages, while being alternately shifted one from the other. As a result, the number of memory transistors at the time of the programming operation is reduced, such that the current used at the time of the programming operation is reduced, and the current supply capability of a step-up circuit can be lowered.

3 Claims, 3 Drawing Sheets

DATA

DATA

NON-VOLATILE SEMICONDUCTOR INTEGRATED CIRCUIT

BACKGROUND OF THE INVENTION

1. Technical Field of the Invention

The present invention relates to a programming sequence of a non-volatile semiconductor device that performs a page programming in a unit of word lines, such as a NAND type flash memory.

2. Conventional Technology

FIG. 5 shows a conventional example of a circuit diagram of a non-volatile semiconductor integrated circuit.

FIG. 5 shows a memory cell array 1, a programming and verification page buffering circuit 2, a row decoder 3, a step-up circuit 4, and a control circuit 5. The row decoder 3 is connected through word lines, and the programming and verification page buffering circuit 2 is connected through bit lines, to respective memory transistors that compose the memory cell array 1. In general, in a NAND type flash memory, a programming operation is conducted for all memory transistors together that are connected to selected ones of the word lines. In other words, a page programming is conducted in a unit of word lines. At present, the size of a page is prevailingly 512 bytes The above operation is described. First, one of the word lines is selected by the row decoder 3. At the same time, data for 512 bytes is retained at the programming and verification page buffering circuit 2. In this state, the step-up circuit 4 is operated to apply a high voltage to word lines or bit lines, whereby a programming is executed for the memory transistors. Whether or not the programming is executed for the memory transistors is determined based on data retained at the programming and verification page buffering circuit 2.

FIG. 6 shows a programming sequence of a conventional example.

As shown in FIG. 6, the programming sequence is switched later to a verification operation that judges if the memory transistors are sufficiently programmed. When there are memory transistors that are not sufficiently programmed, the programming operation and verification operation are performed again, and when all of the memory transistors are programmed, the programming sequence is completed.

In the conventional technology described above, since memory transistors for one page, in other words, 512 bytes are simultaneously programmed, the step-up circuit 4 requires a large current supply capability that matches such an operation.

The present invention provides solutions to the problems described above, and its object is to make a programming operation possible even with a step-up circuit that does not require a large current supply capability.

SUMMARY OF THE INVENTION

In a programming sequence of a non-volatile semiconductor integrated circuit in accordance with the present invention that performs a page programming in a unit of word lines, the non-volatile semiconductor integrated circuit is characterized in dividing the page section into at least two or more parts, simultaneously performing a programming operation for only a part of the divided parts and a verification operation for the remaining divided part, and alternately conducting these steps.

Also, in a second programming sequence of a non-volatile semiconductor integrated circuit in accordance with the present invention that performs a page programming in a unit of word lines, the non-volatile semiconductor integrated circuit is characterized in that the page section is composed of at least two or more page sections, wherein a programming operation for only a part of the page sections and a verification operation for the remaining page section are simultaneously performed, wherein these steps are alternately conducted.

By the device described above, since the programming operation and the verification operation are alternately executed in divided parts or pages, while being shifted one from the other, the number of memory transistors used at the time of the programming operation is reduced, such that the current at the time of the programming operation is reduced, and the current supply capability of a step-up circuit can be lowered.

DETAILED DESCRIPTION OF THE PREFERRED EMBODIMENTS OF THE PRESENT INVENTION

Figure 1:
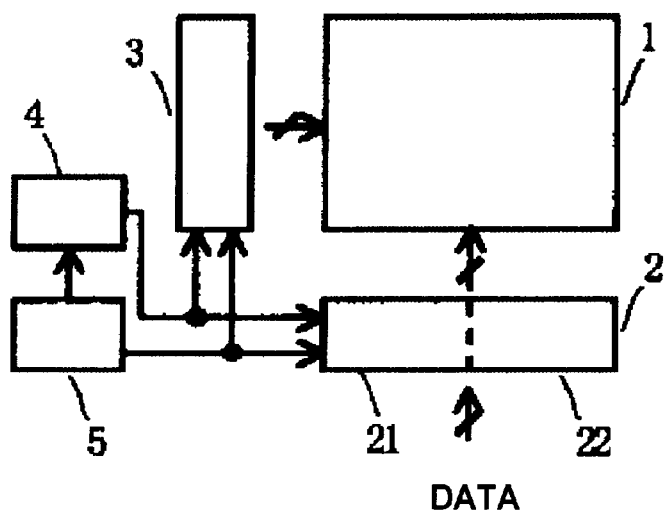
FIG. 1 shows a circuit diagram of a non-volatile semiconductor integrated circuit in accordance with a first embodiment of the present invention.

FIG. 1 shows a circuit diagram of a non-volatile semiconductor integrated circuit in accordance with a first embodiment of the present invention.

FIG. 1 shows a memory cell array 1, a programming and verification page buffering circuit 2, a row decoder 3, a step-up circuit 4, and a control circuit 5. The row decoder 3 is connected through word lines, and the programming and verification page buffering circuit 2 is connected through bit lines, to respective memory transistors that compose the memory cell array 1.

Here, the programming and verification page buffering circuit 2 is divided into two parts 21 and 22. For example, when one page contains 512 bytes, it is divided into two parts each composed of 256 bytes.

An operation thereof is described. First, one of the word lines is selected by the row decoder 3. At the same time, data for 512 bytes is retained at the programming and verification page buffering circuit 2. In this state, the step-up circuit 4 is operated to apply a high voltage to word lines or bit lines, whereby a programming is executed for the memory transistors. Whether or not the programming is executed for the memory transistors is determined based on data retained at the programming and verification page buffering circuit 2.

Figure 2:
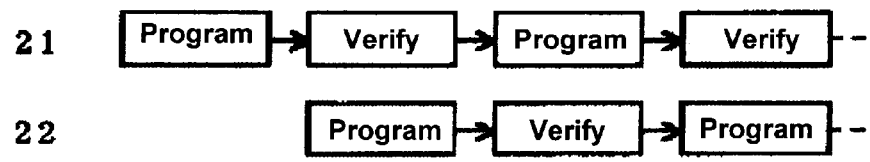
FIG. 2 is a diagram of a programming sequence of the first embodiment of the present invention.

FIG. 2 is a diagram of a programming sequence of the first embodiment of the present invention.

As indicated in the programming sequence shown in FIG. 2, a programming operation and a verification operation are alternately conducted for the two parts 21 and 22, which are mutually shifted one from the other. For this reason, a step-up current supply capability only for 256 bytes is required for the programming.

Figure 3:
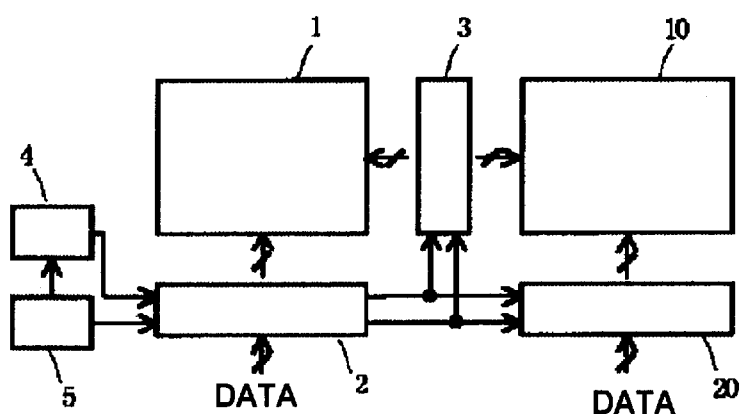
FIG. 3 shows a circuit diagram of a non-volatile semiconductor integrated circuit in accordance with a second embodiment of the present invention.

FIG. 3 shows a circuit diagram of a non-volatile semiconductor integrated circuit in accordance with a second embodiment of the present invention.

FIG. 3 shows memory cell arrays 1 and 10, programming and verification page buffering circuits 2 and 20, a row decoder 3, a step-up circuit 4, and a control circuit 5. The row decoder 3 is connected through word lines, and the programming and verification page buffering circuits 2 and 20 are connected through bit lines, to respective memory transistors that compose the memory cell arrays 1 and 10, respectively.

Here, each of the programming and verification page buffering circuits 2 and 20 is composed of one page, for example, 512 bytes, such that transistors for two pages are programmed with one command.

Figure 4:
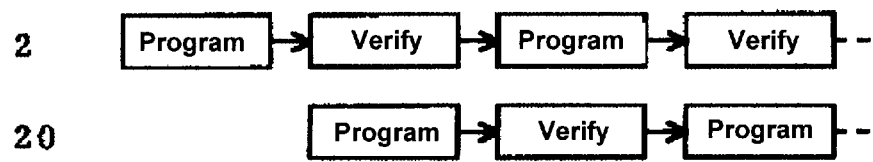
FIG. 4 is a diagram of a programming sequence of the second embodiment of the present invention
Figure 5:
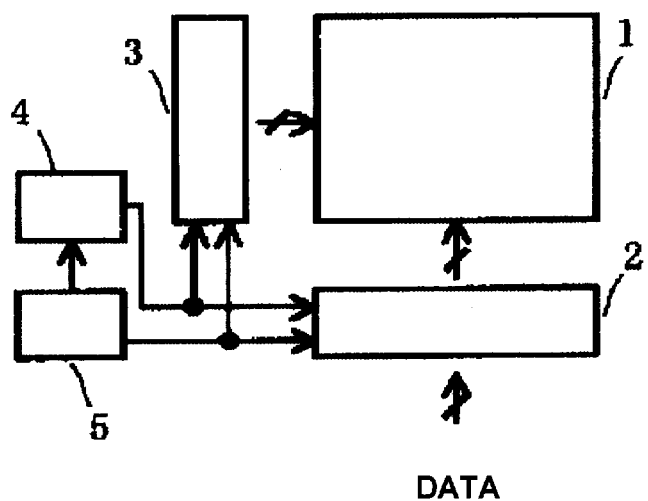
FIG. 5 shows a conventional example of a circuit diagram of a non-volatile semiconductor integrated circuit.
Figure 6:
FIG. 6 is a programming sequence of a conventional example.

FIG. 4 is a diagram of a programming sequence of the second embodiment of the present invention.

As indicated in the programming sequence shown in FIG. 4, a programming operation and a verification operation are alternately conducted for the programming and verification page buffering circuits 2 and 20, which are mutually shifted one from the other. For this reason, a step-up current supply capability only for one page is required for the programming.

It is noted that the first and second embodiments are described as having two divided parts and two pages, respectively. However, they can be structured with two or more parts, and two or more pages, respectively. For example, in the case of four divided parts, a programming operation may be conducted for one divided portion, in other words, for 126 bytes, and a verification operation may be conducted for the remaining three divided sections, which requires a current supply capability only for 126 bytes.

Also, the first and second embodiments are described as having a step-up circuit. However, embodiments with a step-down circuit can provide similar effects.

With the present invention described above, a programming sequence is conducted such that a programming operation and a verification operation are executed in divided parts or pages, while being alternately shifted one from the other. As a result, the current supply capability at the time of the programming operation is restricted, and therefore the current supply capability of a step-up or step-down circuit can be lowered. Also, this can avoid an enlargement of a layout area for the step-up or step-down circuit, and suppress generation of noises accompanied with the operations.

Also, the effects described above would be further enhanced when, in the future, the number of bytes for one page is increased, and a plurality of pages are programmed for the same command.

The entire disclosure of Japanese patent application number 2001-243029 filed Aug. 9, 2001 is hereby incorporated by reference.

What is claimed is:

1. A programming sequence of a non-volatile semiconductor integrated circuit that performs programming of a page section in word line units comprising:

dividing the page section into at least two parts;

simultaneously performing a programming operation for a first number of the divided parts and a verification operation for the remaining number of the divided parts; and alternately conducting the programming operation and the verification operation.

2. A programming sequence of a non-volatile semiconductor integrated circuit that performs programming of a page in word line units, the page being composed of at least two page sections, the sequence comprising:

simultaneously performing a programming operation for a first part of the page sections and a verification operation for the remaining part of the page sections; and alternately conducting the programming operation and the verification operation.

3. A programming sequence of a non-volatile semiconductor integrated circuit that performs page programming in word line units, the sequence comprising:

dividing a page into at least two parts;

simultaneously performing a programming operation for a first subset of the two parts and a verification operation for the remainder of the two parts; and alternately conducting the programming operation and the verification operation.

* * * * *